United States Patent
Avalos et al.

(10) Patent No.: US 10,815,942 B1
(45) Date of Patent: *Oct. 27, 2020

(54) COMBUSTION ENGINE ELECTROMAGNETIC ENERGY DISRUPTOR

(71) Applicant: Harmoniks, Incorporated, Las Vegas, NV (US)

(72) Inventors: Jerry Anthony Avalos, Anaheim, CA (US); Vanessa Grace Jao Herrera, Anaheim, CA (US)

(73) Assignee: Harmoniks, Incorporated, Las Vegas, NV (US)

( * ) Notice: Subject to any disclaimer, the term of this patent is extended or adjusted under 35 U.S.C. 154(b) by 246 days.

This patent is subject to a terminal disclaimer.

(21) Appl. No.: 15/943,521

(22) Filed: Apr. 2, 2018

Related U.S. Application Data (63) Continuation of application No. 15/690,098, filed on Aug. 29, 2017, now Pat. No. 9,963,111.

(51) Int. Cl.
| | |
|---|---|
| *F02M 27/04* | (2006.01) |
| *F02B 3/06* | (2006.01) |
| *F02M 27/06* | (2006.01) |
| *H05K 9/00* | (2006.01) |

(52) U.S. Cl.
CPC ............. *F02M 27/045* (2013.01); *F02B 3/06* (2013.01); *F02M 27/06* (2013.01); *H05K 9/0083* (2013.01)

(58) Field of Classification Search
None
See application file for complete search history.

(56) References Cited

U.S. PATENT DOCUMENTS

| | | | | |
|---|---|---|---|---|
| 4,469,076 A | * | 9/1984 | Wolff | F02M 27/045 123/536 |
| 4,783,279 A | | 11/1988 | Peterman | |
| 5,460,144 A | * | 10/1995 | Park | F02M 27/045 123/538 |

(Continued)

OTHER PUBLICATIONS

Epoxy Hardness Test document (Univ. of Edinburgh) (Year: 2017).

(Continued)

*Primary Examiner* — Kevin M Bernatz
(74) *Attorney, Agent, or Firm* — Sean Casey (57) ABSTRACT

A combustion engine electromagnetic energy disruptor includes shaped disruptor carried in an enclosure, and configured to disrupt, distort, and/or agitate electromagnetic energy proximate a combustion engine and fuel system. The disruptor incorporates electromagnetically responsive constituents dispersed in a substantially water-free resin hardened above about Shore D 60 into a predetermined volume and density. The resin and constituents are combined to have a mass ratio of about 50% resin and 50% powdered constituents. A permittivity of the enclosure does not exceed about 3.5, and of the resin and constituents in combination substantially exceeds about 3.5. The resin includes a urethane resin that is mixed prior to curing into a substantially homogenous dispersion with the constituents. The constituents include one or more of piezoelectric, diamagnetic, paramagnetic, ferrimagnetic, and ferromagnetic materials. Such materials include one or more of powdered quartz, black tourmaline, magnetite, iron, iron oxide, zinc oxide, copper oxide, aluminum, and graphite.

20 Claims, 1 Drawing Sheet

(56) References Cited

U.S. PATENT DOCUMENTS

| | | | | |
|---|---|---|---|---|
| 5,487,370 | A * | 1/1996 | Miyazaki | F02M 27/045 |
| | | | | 123/538 |
| 5,632,254 | A * | 5/1997 | Kim | F02M 27/045 |
| | | | | 123/538 |
| 5,863,404 | A * | 1/1999 | Fujimaki | F02M 27/00 |
| | | | | 123/538 |
| 6,864,418 | B2 | 3/2005 | Wang | |
| 7,377,269 | B1 * | 5/2008 | Lai | F02M 27/045 |
| | | | | 123/538 |
| 7,815,820 | B2 * | 10/2010 | Tan | H05K 9/0083 |
| | | | | 250/515.1 |
| 9,963,111 | B1 * | 5/2018 | Avalos | H01F 1/113 |
| 2005/0241626 | A1 * | 11/2005 | Hashimoto | C10G 32/02 |
| | | | | 123/538 |
| 2007/0163552 | A1 | 7/2007 | Kitajima et al. | |
| 2011/0147073 | A1 * | 6/2011 | Kume | B82Y 25/00 |
| | | | | 174/391 |
| 2014/0273790 | A1 | 9/2014 | Alexander | |
| 2016/0113162 | A1 | 4/2016 | Lin | |

OTHER PUBLICATIONS

Relative Permittivity of Epoxy resins (Engineer Toolbox) (Year: 2017).

Relative Permittivity of Aluminum (Material Property Database) (Year: 2017).

* cited by examiner

COMBUSTION ENGINE ELECTROMAGNETIC ENERGY DISRUPTOR

CROSS REFERENCE TO RELATED PATENT APPLICATIONS

This application has common inventors with, is co-owned and co-pending with, claims priority to, and is a continuation of U.S. non-provisional application Ser. No. 15/690,098 filed Aug. 29, 2017, now U.S. Pat. No. 9,963,111 granted May 8, 2018, which is incorporated by reference herein in its entirety as though fully set forth herein.

TECHNOLOGICAL FIELD

The present disclosure relates generally to systems and methods for disrupting, agitating, and distorting ambient electromagnetic energy proximate a combustion engine of a vehicle.

BACKGROUND

Many types of conventional, petrochemically powered vehicles have been designed for various applications, and which each include a combustion engine that burns various types of gasoline and diesel fuels to power the engine. Such vehicles are often designed to enable the efficient utilization of such fuels to improve the performance of the vehicle for a particular application, and the distance the vehicle can travel with a fixed amount of fuel. Additional capabilities attempt to reduce the emissions of various combustion by-products, which include vapors, gases, and particles. Prior systems, devices, and methods have been contemplated that attempt to optimize such performance, improve fuel utilization, and reduce emissions. Some such attempts have included efforts to adjust properties of fuels prior to combustion, adjust the combustion processes during fuel burn, and modify the constituents of combustion by-products prior to emission.

SUMMARY

The disclosure is directed to devices and methods for improving vehicle performance with increases in nominal acceleration and reduced fuel consumption and unwanted emissions of combustion engines. In particular, a new device and method is contemplated that can be installed in any conventional automotive or other vehicle near a combustion engine and fuel system. The device and method described is configured to distort and disrupt ambient electromagnetic energy and fields proximate such engines and fuel systems, such that emissions and fuel consumption are reduced while improving vehicle performance during acceleration and cruise operation.

Specifically, a combustion engine electromagnetic energy disruptor includes a shaped disruptor that is carried within and encased in an enclosure, and which is formed into a shape with a predetermined volume and density. The disruptor is configured to agitate, disrupt, distort and/or adjust electromagnetic energy and fields proximate a combustion engine and fuel system. The disruptor includes constituents that enable the agitation, adjustment, distortion, and disruption with electromagnetically responsive properties, such that incident, ambient, proximate electromagnetic energy or radiation is agitated, disrupted, distorted, and/or adjust by being absorbed, attenuated, and in some cases re-radiated with frequencies and energies that differ from the incident energy. As used herein, the terms agitate, disrupt, distort, and/or adjust are used to describe the effect that the disruptor is imposing on proximate electromagnetic energy, by causing such energy to be absorbed, attenuated, and in some cases re-radiated. The constituents are dispersed in a substantially water-free resin that is cured to be hardened above about a 60 hardness on the Shore durometer Type D scale ("Shore D scale").

The enclosure is formed from a material that is compatible for use in and near an engine compartment of an automotive or other vehicle, and to have a static permittivity (also known as a permittivity relative to a vacuum) of less than approximately 3.5. The resin and constituents are selected to have various piezoelectric and electromagnetic properties, which in combination, substantially exceed a static permittivity of about 3.5. Further, the resin is selected to be and/or substantially include a urethane resin, which is mixed prior to curing into a substantially homogenous dispersion with the constituents. To electromagnetically and mechanically adjust the resin and constituents relative to one another during curing, the dispersion may be irradiated while curing with acoustic and electromagnetic energy at predetermined frequencies and energies.

In variations of the contemplated disruptor, the constituents further include one or more materials that have piezoelectric, diamagnetic, paramagnetic, ferrimagnetic, and ferromagnetic properties. Such piezoelectric, diamagnetic, paramagnetic, ferrimagnetic, and ferromagnetic materials may include, for example but not for purposes of limitation, one or more of powdered quartz, black tourmaline, magnetite, iron, iron oxide, zinc oxide, copper oxide, aluminum, and graphite.

The disruptor typically includes the resin and the combined constituents being combined approximately in a one-to-one ratio in various formulations, which have been found to enable the preferred piezoelectric and electromagnetic capabilities. In further examples, the disruptor includes the constituents and resin being combined in a mass ratio of about 50% resin and 50% powdered constituents. Such constituents in one modification include about 7.45% each of quartz, black tourmaline, and magnetite, about 5.32% each of iron, iron oxide, zinc oxide, copper oxide, and aluminum, and about 1.08% graphite.

Additional arrangements of the disruptor include the constituents being selected to have diamagnetic properties, and to include at least one of and/or one or more of: (a) quartz having a permittivity of about between 4.2 and 6.5, (b) zinc oxide having a permittivity of about between 1.7 and 2.5, and (c) graphite having a permittivity of about between 12 and 15. In this arrangement, the combined permittivity of the diamagnetic constituents when cured in the resin is configured so that it substantially exceeds about 3.5.

In other modifications of the disruptor, for additional illustration purposes without limitation, the constituents are selected to have paramagnetic properties and to include one or more of: (a) iron oxide having a permittivity of about 14, (b) copper oxide having a permittivity of about 18, and (c) aluminum powder having a permittivity of about between 1.6 and 1.8. Here, the dispersion of the resin and paramagnetic constituents have a combined permittivity that substantially exceeds about 3.5.

Still other variations of the disruptor are contemplated, and include the constituents selected to be at least one, and/or one or more of ferromagnetic and ferrimagnetic constituents, which include: (a) Schorl tourmaline having a permittivity of about between 5 and 7, (b) magnetite having a permittivity of about between 20 and 100, and (c) iron powder having a permittivity exceeding about 9,000. As with earlier adaptations, the combined permittivity of such ferromagnetic and ferrimagnetic constituents substantially exceeds about 3.5.

The methods of the disclosure include disrupting electromagnetic energy and fields of a combustion engine, by forming a disruptor within an enclosure to have a volume and density, configured to disrupt and agitate ambient electromagnetic energy and fields proximate a combustion engine and fuel system, with a plurality of dispersed piezoelectric, diamagnetic, paramagnetic, ferrimagnetic, and ferromagnetic constituents; and wherein a respective permittivity of the: (a) enclosure is substantially below about 3.5, and (b) resin and constituents in combination substantially exceeds about 3.5. As with other described arrangements, the method further includes combining in the disruptor, the constituents with a hardened resin in about a one-to-one ratio.

This modification of the methods includes configuring the constituents to be powdered and to include about 7.45% each of quartz, black tourmaline, and magnetite, about 5.32% each of iron, iron oxide, zinc oxide, copper oxide, and aluminum, and about 1.08% graphite. Also contemplated is further configuring the piezoelectric and diamagnetic constituents to include one or more of: (a) the quartz having a permittivity of about between 4.2 and 6.5, (b) the zinc oxide having a permittivity of about between 1.7 and 2.5, and (c) the graphite having a permittivity of about between 12 and 15, such that a combined permittivity of the diamagnetic constituents substantially exceeds about 3.5.

In additional variations, the method for disrupting electromagnetic energy and fields includes combining in the disruptor, the paramagnetic constituents to include one or more of: (a) iron oxide having a permittivity of about 14, (b) copper oxide having a permittivity of about 18, and (c) aluminum powder having a permittivity of about between 1.6 and 1.8, and the ferromagnetic and ferrimagnetic constituents to include one or more of: (a) Schorl tourmaline having a permittivity of about between 5 and 7, (b) magnetite having a permittivity of about between 20 and 100, and (c) iron powder having a permittivity exceeding about 9,000. Here too, these examples enable a combined permittivity of the paramagnetic constituents, and/or ferromagnetic and ferrimagnetic constituents, to substantially exceed about 3.5.

This summary of the implementations and configurations of the contemplated disruptors and methods of disrupting electromagnetic energy near combustion engines, describe in less technically detailed descriptions, several exemplary arrangements for the embodiments of this disclosure, and such are further described in more detail below in the detailed description in connection with the accompanying illustrations and drawings, and the claims that follow.

This summary is not intended to identify key features or essential features of the claimed technology and capabilities, nor is it intended to be used as an aid in determining the scope of the claimed technology and subject matter. The capabilities, advantages, variations, arrangements, modifications, features, and functions described here may be accomplished independently in various example configurations, and/or may be combined in yet other example implementations, as is further contemplated and explained elsewhere herein, and which may also be understood by those knowledgeable and having skill in the relevant fields of technology, and with reference to the following description and drawings.

BRIEF DESCRIPTION OF THE DRAWINGS

A more complete understanding of example implementations of the present disclosure may be derived by referring to the detailed description and claims when considered with the following figures, wherein like and similar reference numbers refer to similar, related, and/or identical elements throughout the figures. The figures and annotations thereon are provided to facilitate understanding of the disclosure without limiting the breadth, scope, scale, or applicability of the disclosure. The drawings are not necessarily made to scale and may be schematic diagrams intended to describe the disclosure to those knowledgeable in the relevant fields of technology.

DETAILED DESCRIPTION

Embodiments of the present disclosure are described herein. It is to be understood, however, that the disclosed embodiments are merely examples, and that other embodiments and alternative arrangements thereof can take other various and preferably optional forms. The figures include some features that may be exaggerated or minimized to show or emphasize details of certain features, capabilities, constituents, components, and/or elements. Therefore, specific structural and functional details disclosed herein are not intended to be and must not be interpreted as limiting, but merely as a representative and illustrative basis for demonstrating to and teaching those skilled in the art to variously employ the embodiments of this disclosure.

As those of ordinary skill in the art should understand, various features, elements, constituents, capabilities, components, and processes illustrated and described with reference to any one of the figures may be combined with features, components, elements, constituents, methods, and processes illustrated in one or more other figures to produce embodiments that should be apparent to and within the knowledge of those skilled in the art, but which may not be explicitly illustrated or described. The combinations of features illustrated here are representative embodiments for many typical applications. Various combinations and modifications of the features consistent with the teachings of this disclosure, however, could be desired for particular applications or implementations, and should be readily within the knowledge, skill, and ability of those working in the relevant fields of technology.

Figure 1:
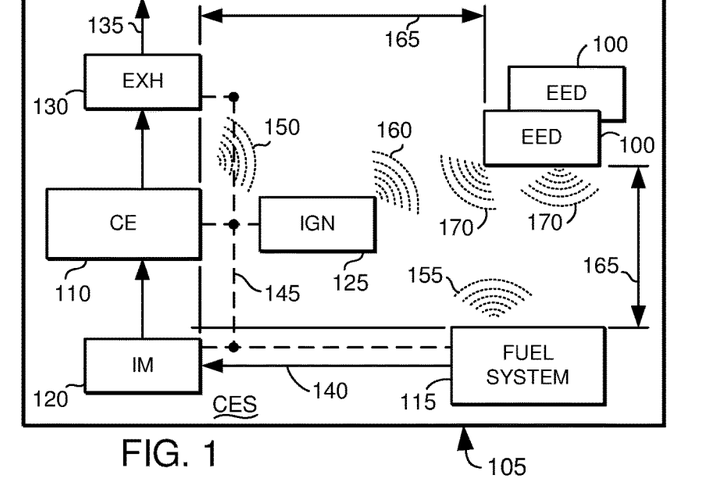
FIG. 1 is an illustration of a combustion engine electromagnetic energy disruptor and its components, constituents, features, and methods of operation.

With reference now to the various figures and illustrations and to FIGS. 1, 2, 3, and 4, and specifically now to FIG. 1, a schematic diagram of a combustion engine electromagnetic energy disruptor is depicted in connection with an application directed to use with a combustion engine. Although described here in connection with an exemplary automotive application, the disclosure contemplates nearly any application utilizing a combustion engine to generate power by burning petrochemical fuels.

With attention invited again to FIG. 1, at least one and/or one or more combustion engine electromagnetic energy disruptor(s) (EEDs) 100 may be utilized with a combustion engine system (CES) 105, which includes an internal combustion engine (CE) 110. Such a CES 105 may be any type of petrochemically powered vehicle or device, such as for purposes of example without limitation, an automotive vehicle or truck, a warehouse logistics vehicle such as a tractor or forklift, an aircraft, a marine vehicle, a portable device such as a combustion-engine-powered landscaping device (mower, trimmer, leaf blower, etc.), an electrical generator, a construction vehicle, a mining or petrochemical drilling rig, many types of combustion powered systems that include steam plants, petrochemical fired furnaces and boilers and kilns and ovens, electrical power generation facilities, and any number of other similarly combustion engine and petrochemical combustion powered devices and machines.

For most applications of EED(s) 100 contemplated by the disclosure, CE 110 includes a fuel system 115 that supplies a petrochemical and/or hydrocarbon fuel to CE 110 in connection with an intake manifold (IM) 120 that may include fuel injectors, a carburetor, and/or another type of fuel/air control system. An ignition system (IGN) 125 is typically also included to control timing of fuel ignition during operation. Such CESs 105 also typically include an exhaust control system (EXH) 130 that is often configured to attenuate sound emissions with a muffler device and possibly also to catalyze combustion by-products to reduce unwanted effluent waste, exhaust gases 135. Depending on the particular application, power output, and complexity, the components of CES 105 are typically coupled together via a fuel line 140, fuel/air mixture intake manifold 120, signal and power lines 145, and other components.

During operation, each of such components of CES 105 has been observed to emit various types of acoustic and/or electromagnetic energy and to establish in some circumstances electromagnetic fields of various powers, energies, and frequencies. For example, CE 110 and its various subcomponents emit EME 150 having various other frequencies and energies. Similarly, fuel system 115 of many CESs 105 also has been found to emit electromagnetic energy (EME) 155. Additionally, IGN 125, whether carbureted or fuel injected, also has been discovered to emit EME 160 of still other frequencies and energies. While various other components of CESs 105 have also been observed to emit various EME, the emissions from CE 110, fuel system 115, and IGN 125 has been observed in most cases to generate the dominant, highest power EME 150, 155, 160, while the other sources have been observed to generate much lower power EME.

During various experiments designed to adjust performance of such CESs 105, it has been observed that power output, fuel consumption, and/or exhaust gases change in response to fluctuations in such EME. Consequently, various components and methods were fabricated to adjust such EMEs and to improve various characteristics of such power output, fuel consumption, and/or exhaust gases. Such experiments also established electromagnetically effective distances (EDs) 165 for operation of such components and methods, as well as effective configurations of shape, volume, density, and compositions therefor, which in some applications have further enabled attenuated, shifted, reflected, and/or responsively emitted EME (REM) 170 having various other desirable frequencies and energies according to such configurations.

Figure 2:
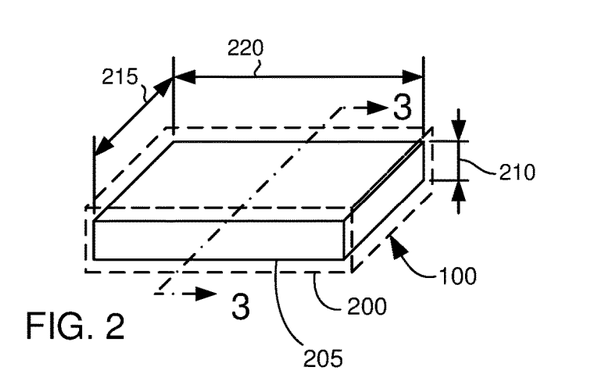
FIG. 2 illustrates additional aspects and features of the disruptor and methods of FIG. 1, with certain components and features added, removed, modified, and rearranged.

With continuing reference to the figures, and especially now FIGS. 1 and 2, EED 100 includes an enclosure 200 (depicted with dashed lines for enhanced illustration) that encases a shaped disruptor 205. The shaped disruptor 205 is formed into a shape with a predetermined volume and density, and for exemplary purposes is shown to have a substantially cuboid arrangement. However, many other equally suitable shapes may be employed in view of preferred applications and positioning requirements of such applications of EED 100 and CES 105. Additionally, for CES 105 applications directed to small mobile devices up to larger automotive applications, shaped disruptor 205 is preferably configured to have a density of between about 0.60 and about 0.90 grams per cubic centimeter (g/cm^3), and a volume ranging approximately between 70 and 300 cm^3.

In view of these configurations, and with continuing reference to FIG. 2, the exemplary shaped disruptor 205 having a substantially cuboid form may include rectilinear dimensions ranging approximately between 1.5 and 11.0 centimeters ("cm") in thickness 210, and approximately between 4.5 and 10.0 cm in either and/or both width 215 and length 220. More specifically, shaped disruptor 205 in one configuration for mobile and small automotive applications of CES 105, may have rectilinear dimensions of approximately 1.9 cm thick (210) by 5.1 cm wide (215) by 7.6 cm long (220), or about 0.75 inches thick (210) by 2.0 inches wide (215) by 3.0 inches long (220), which results in a volume of about 73.7 cm^3 or about 4.5 inches^3 (cubic inches).

In another arrangement also contemplated for small automotive or logistics applications of EED 100 and CES 105, shaped disruptor 205 is configured to be larger and about 2.54 cm or about 1.0 inches thick (210) with the other dimensions (215, 220) remaining the same, which establishes a volume of about 98.3 cm^3 or about 6.0 inches^3. In further examples for larger applications, shaped disruptor 205 is formed to be about 10.2 cm thick (210) and 5.1 cm in width (215) and length (220) (about 4 by 2 by 2 inches), to have a volume of about 262.2 cm^3 or about 16.0 inches^3. For various other applications of EED 100 and CES 105, other shapes and dimensions may be preferred to enable a target volume of shaped disruptor 205 that is electromagnetically effective, as is described in further examples elsewhere herein.

In view of these exemplary configurations, enclosure 200 is formed with suitable shapes and dimensions to surround and encase shaped disruptor 205. Enclosure 205 is formed from a material that is substantially electromagnetically unresponsive, and which is compatible for use in and near high temperature components of CES 105, such as that which may be encountered in an engine compartment of an automotive or other vehicle. Further, enclosure 205 enables shaped disruptor 205 to interact with electromagnetic energy proximate to EED 100, and is formed from a material that has a static permittivity of less than approximately 3.5. One such suitable material, for purposes of example only but not limitation, includes various types of polyethylene ("PE") and polytetrafluoroethylene ("PTFE" or "Teflon") and related materials that are substantially electromagnetically unresponsive, and which have been observed to have static permittivities of between about 2.1 and 2.2.

Static permittivity as used herein is also known to those with knowledge in the field of technology as a determined permittivity relative to a vacuum, as well as in other systems of measurement and nomenclature, as a dielectric constant, which is often interchangeably used when utilizing certain measurement unit reference systems. For purposes of the disclosure, various permittivity test and qualification laboratory techniques may be suitable for use, and include for purposes of example without limitation selecting the described candidate constituents and determining respective dielectric constants utilizing any of the many commercially available capacitance test procedures and systems, and then calculating relative permittivity, according standard laboratory procedures. For further example, a reference material having a pre-established, known permittivity and/or dielectric constant may be utilized as a calibration standard in a capacitance test apparatus. Addition of a candidate constituent may then be added thereto, and a new dielectric constant measured, which may then be utilized to compute an offset value, which may in turn be adjusted to roughly estimate the permittivity and/or dielectric constant of the candidate constituent.

EED 100 and shaped disruptor 205 are configured to adjust, disrupt, attenuate, absorb, distort, re-radiate, and/or agitate electromagnetic energy and fields 150, 155, 160 proximate CES 105 in the described configurations, which in turn causes and enables the improved performance and power, and reduced fuel consumption and combustion by-product emissions, of operating combustion engines and combustion powered machines. Disruptor 205 further includes various preferred constituents, which individually and in combination enable such effects with respective electromagnetic properties that are responsive to such incident, ambient, proximate EME 150, 155, 160. Further, such constituents enable in some circumstances reflected, damped, frequency shifted and/or filtered pass through, excitation, and/or re-radiated EME 170, any or all of which EME having frequencies and energies that differ from the incident EME 150, 155, 160. The constituents of disruptor 205 are dispersed either homogenously, heterogeneously, in layers or slices, in arrangements of varying density and particle size distributions along any dimension, and/or in other ways that are preferred for a particular application of CES 105.

Figure 3:
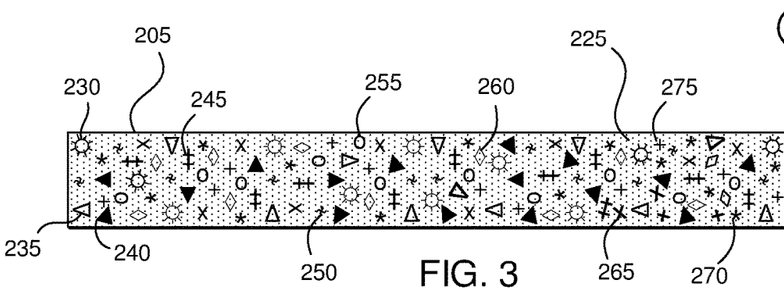
FIG. 3 depicts various aspects of the disruptor of FIGS. 1 and 2, in an schematic section view taken along section line 3-3 of FIG. 2.

In one illustrative example, and with reference now also to FIG. 3, such constituents are homogeneously dispersed about disruptor 205 with and within a substantially water-free resin 225, which resin is selected to have a permittivity of less than about 3.5. One such example resin may be a two component, low viscosity, rigid urethane having minimal shrinkage, capable of a cured hardness that equals or exceeds at least about 60 hardness, and more preferably at least about 75 to 80, on the Shore durometer Type D scale ("Shore D scale").

Further, it is preferable that such example resins also have a permittivity less than about 3.5, and that it be substantially electromagnetically unresponsive. Many such urethane resins have been observed to have a permittivity of about 2.1 or less, such that the performance and respective permittivities of the contemplated EME responsive constituents is/are unaffected by the selected resin. In this way, the assembled EED 100 with the encased and/or encapsulated disruptor 205 are configured to achieve the preferred permittivity substantially exceeding about 3.5.

In the example of disruptor 205 having a homogenous dispersion of the contemplated constituents as depicted schematically in FIG. 3, the constituents include materials having various piezoelectric and electromagnetic properties that in combination form a composite material of disruptor 205 that substantially exceeds a static permittivity of about 3.5. In such an exemplary and illustrative arrangement, such constituents further include one or more and/or at least one of: a piezoelectric material 230, a diamagnetic material 235, a paramagnetic material 240, a ferrimagnetic material 245, and a ferromagnetic material 250, each of which is selected to have a respective permittivity that substantially exceeds about 3.5.

Such constituent materials may include, for more specific examples without limitation, one or more and/or at least one powdered material, including a piezoelectric and diamagnetic material such as quartz 255, a diamagnetically responsive material such as zinc oxide and certain forms of graphite 260, ferromagnetic materials such as iron and Schorl-type black tourmaline 265, a ferrimagnetically material such as certain forms of magnetite 270, paramagnetic materials such copper and iron oxides and aluminum powder 275, and other types of similarly EME responsive and active materials, which in combination form shaped disruptor 205 to have the preferred permittivity that substantially exceeds about 3.5.

Experimentation has established that disruptor 205 can be optimized for certain CES 105 applications that include smaller mobile as well as larger automotive applications, when resin 225 and the combined constituent materials 230, 235, 240, 245, 250 are combined approximately in a one-to-one ratio by mass or weight in the contemplated formulations. Such have been demonstrated to enable the preferred piezoelectric and electromagnetic capabilities. In one specific example for purposes of further illustration but not limitation, shaped disruptor 205 includes such resin 225 and such constituent materials 230, 235, 240, 245, 250 combined in a mass ratio of about 50% cured resin and 50% powdered constituents.

Such constituents in one modification include about 7.45% each of quartz 255, Schorl-type black tourmaline 265, and ferrimagnetically responsive magnetite 270, about 5.32% each of iron 265, iron oxide 275, zinc oxide 260, copper oxide 275, and aluminum 275, and about 1.08% graphite 260. In such exemplary but not limiting example configurations, disruptor 205 includes such constituent powdered materials to have the expected and respective diamagnetic properties, and such that at least one of and/or one or more of: (a) quartz 255 has a permittivity of about between 4.2 and 6.5, (b) zinc oxide 260 has a permittivity of about between 1.7 and 2.5, and (c) graphite 260 has a permittivity of about between 12 and 15. In this arrangement, the combined permittivity of the diamagnetic constituents 230, 235 when cured in resin 225 substantially exceeds about 3.5 as is preferred.

In other configurations of disruptor 205, and for additional illustration purposes without limitation, the EME responsive and active powdered constituents are selected to have paramagnetic properties and to include one or more of: (a) iron oxide 275 having a permittivity of about 14, (b) copper oxide 275 having a permittivity of about 18, and (c) aluminum 275 having a permittivity of about between 1.6 and 1.8. In this example, the substantially homogeneous or differently configured dispersion of resin 225 and paramagnetic constituents 240 have a combined permittivity substantially exceeding about 3.5.

Other modifications of disruptor 205 include as further illustrations, the powdered constituents selected to be at least one, and/or one or more of ferrimagnetic 245 and ferromagnetic 250 constituents, such as: (a) Schorl-type tourmaline 265 having a permittivity of about between 5 and 7, (b) magnetite 270 having a permittivity of about between 20 and 100, and (c) iron 265 having a permittivity exceeding about 9,000. As with earlier variations and examples, the combined permittivity of such ferrimagnetic 245 and ferromagnetic 250 constituents in cured resin 225 substantially exceeds about 3.5.

Figure 4:
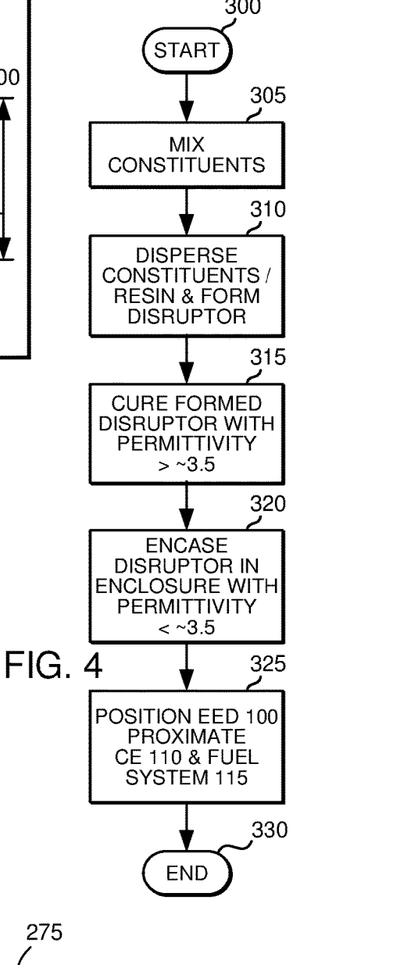
FIG. 4 illustrates variations of methods of forming and using the disruptor of FIGS. 1, 2, and 3, with certain capabilities and features added and/removed for purposes of further illustration.

With continuing reference to the various figures, and now also with attention invited to FIG. 4, the disclosure also contemplates methods of disrupting EME energy and fields 150, 155, 160, of CE 110, proximate CE 110 and fuel system 155. The method starts at step 300 and includes at step 305 forming EED 100 with disruptor 205, by mixing constituents 230, 235, 240, 245, 250 as described elsewhere herein. The mixed constituents at step 310 are mixed homogeneously or using other techniques already described, with uncured resin 225, into a dispersion, which is cured at step 315 into the contemplated disruptor 205 into either predetermined shapes, or a bulk form that may be shaped after curing of resin 225 is complete. Once cured, disruptor 205 may be cut and shaped, unless it was cured into a preferred, predetermined shape, and at step 320 encased in enclosure 200.

This example modification of the methods 300 further includes configuring constituents 230, 235, 240, 245, 250, to be powdered and to include about 7.45% each of quartz 255, Schorl-type black tourmaline 265, and magnetite 270, about 5.32% each of iron 265, iron oxide 275, zinc oxide 260, copper oxide 275, and aluminum 275, and about 1.08% graphite 260. Such variations of the methods also contemplate configuring and/or selecting the piezoelectric 230 and diamagnetic 235 constituents as already described elsewhere herein, such that a combined permittivity of the diamagnetic constituents 235 substantially exceeds about 3.5. Similarly, the paramagnetic constituents 240 and the ferrimagnetic and ferromagnetic constituents 245, 250 are also configured and/or selected such that a combined permittivity thereof substantially exceeds about 3.5.

In variations, disruptor 205 may be cured within enclosure 200 to form EED 100, and/or in position within CES 105 in a preformed enclosure 200 that forms a part of CES 105 that becomes an integral form of EED 100, when such is preferred for certain applications. Depending upon the application, and if disruptor 205 is encased in independent enclosure 200 and is therefore portable, then assembled EED 100 is at step 325 positioned proximate CES 105, and within the electromagnetically effective distances 165. Such electromagnetically effective distances to CE 110, fuel system 115, IGN 125, and other components of CES 105 have been found for the described examples to range approximately less than about 100 centimeters, and in some configurations of disruptor 205 and CES 105 applications even greater distances.

With the method generally concluding at step 330, an EME effective EED 100 is thereby formed and installed, and with the example predetermined volumes and density, is thereby configured to disrupt, agitate, attenuate, distort, re-radiate, and/or dampen EME energy and fields 150, 155, 160, and to responsively in certain applications to excite constituents 230, 235, 240, 245, 250, and to thereby re-radiate EME 170. As used herein, the terms agitate, disrupt, distort, and/or adjust are used to describe the effect that the disruptor is imposing on proximate electromagnetic energy, by causing such energy to be absorbed, attenuated, and in some cases re-radiated, which in turn enables and causes the described performance and related improvements in operation of the noted combustion engines and machines. As a consequence of utilizing EED 100, many various improvements in performance of CES 105 have been observed, which include improved power output and/or acceleration of CE 110, reduced fuel consumption, and reduced emissions of unwanted and increased emissions of preferred combustion by-products in exhaust gases 135.

In an exemplary application of CES 105, a Stihl model F545 two-stroke engine was tested using EED 100 configured to have a volume of about 73.7 cm^3 and a cuboid shape of about 1.9 cm by 5.1 cm by 7.6 cm, with a disruptor formed according to the described examples. The Stihl F545 was run continuously during one test with a new spark plug, but without EED 100 installed, for a test spanning three tanks of fuel from a single volume of source fuel, and which in the test was a commercially available gasoline of about 89 octane, also known as "regular" grade gas. The spark plug was inspected and exhibited a brownish residue showing substantial combustion by-product deposits. The non-EED 100 tests for all three tanks of gas saw an average cylinder temperature adjacent the spark-plug, from measurements at 30 second intervals, of 178 degrees Fahrenheit ("deg-F"). A second test was run, with EED 100 installed within less than about 5.0 centimeters of the F545 cylinder head, for another three tanks of gas using the same source of fuel, and also using a new, identical spark plug. The average temperature from the same measurement protocol at the same cylinder location, for the second test, dropped 13 deg-F to 165 deg-F. The spark plug was removed and inspected, and exhibited a like-new finish without any visually apparent residue. These observations circumstantially support more efficient, higher performance operation of the Stihl F545 CES 105 when operated with EED 100 installed.

EED 100 was reconfigured in a similar arrangement but to have a slightly larger volume, for representative tests with automobiles that included a Kia brand "Carens" and an Opel brand "Insignia," both of which were run utilizing regular 89 octane fuel or petrol. An EED 100 was fabricated and installed according to the disclosure and methods, and to have a volume of about 98.3 cm^3, with a cuboid shape of about 2.5 cm by 5.1 cm by 7.6 cm, with a disruptor 205 according to the disclosure. In tests of each automobile, each vehicle was first operated until nominal idling parameters stabilized, and an identical configuration was maintained for each vehicle, which was tested first without EED 100 and then again with EED 100 installed. The Kia "Carens" exhibited an increase in drag power of 19.0% when tested with EED 100 installed within less than about 30 cm of CE 110, and an increase in maximum attainable revolutions per minute ("RPMs") of 19.7%. The Opel "Insignia" exhibited a drag power increase of about 2.5% and a maximum RPM increase of about 5.4%, after installation of EED 100.

In another series of tests, EED 100 was installed within the recommended, EDs 165 proximate CES 105 (less than about 30 cm of CE 110) of both a Nissan brand "200SX," and a Suzuki brand "Swing," which were also both tested using regular 89 octane fuel or petrol. The emissions of the warm and parametrically stabilized vehicles were recorded before and after installation of EED 100. The Nissan 200SX exhibited a 22% decrease in hydrocarbon ("HC") emissions in exhaust gases 135, after installation of EED 100. Similarly, the Suzuki Swing exhibited a 62% reduction in HC emissions in gases 135. Both exemplary tests supported improved fuel burn as a result of the installed EED 100. A variety of additional vehicles were tested in similar ways, and all exhibited improvements in performance, fuel consumption, and emissions in exhaust gases 135, when tested utilized an installed EED 100.

The descriptions herein refer to systems, methods, constituents, components, elements, or features being coupled together, interacting, disrupting, distorting, and/or agitating other components or electromagnetic energy and fields. As used herein, unless expressly stated otherwise, use of these terms and words are intended and must be understood to mean that one component/constituent/method/element/feature is directly or indirectly coupled, joined to, interactive with, responsive to, cooperative with, and/or communicates with another, either electronically, magnetically, mechanically, or combinations thereof, and in some similar way that enables cooperative operation and exchange and interchange of electromagnetic and piezoelectric energy and radiation, and information.

Further, even though the various described implementations, figures, illustrations, and drawings depict representative examples and arrangements of components, elements, fields, energy, devices, and features, many different additional variations, arrangements, modifications, and intervening components, elements, devices, and features, may also be present in further exemplary implementations that are contemplated by the present disclosure.

Terms, words, and phrases used in this document, and variations thereof, unless otherwise expressly stated, must be construed as open ended as opposed to limiting. For example, the term "including" should be understood to mean "including, without limitation" or similar meanings; the term "example" is used to loosely describe illustrative instances of the item being described, but is not an exhaustive, exclusive, or limiting list; and adjectives such as "conventional," "traditional," "normal," "standard," "known", and terms with similar meanings must not be construed to limit the description to a given example, or to an exemplary item commercially available in the market as of a specific date and time period.

Instead, these descriptions are intended to be understood to include conventional, traditional, normal, or standard technologies that may be available now and at any time in the future in some improved and modified form according to the innovations described in this disclosure. Similarly, a group of words described and joined with the conjunction "and" or the disjunctive "or" must be understood only as exemplary and representative but not exclusive groups, and not as requiring that only or each and every one of those described items must be or must not be present in the contemplated group. Rather, use of such conjunctives and disjunctives must be understood to mean "and/or" unless expressly stated otherwise.

Similarly, a group of words linked with the conjunction "or" must not be understood as requiring mutual exclusivity among that group, but rather must also be understood as meaning "and or" unless expressly stated otherwise. Also, although words, items, elements, or components of this disclosure are described or claimed in the singular, the plural is also intended and contemplated to be within the scope of such a description unless limitation to the singular is explicitly stated as a requirement. The presence or absence of broadening words and phrases such as "one or more," "at least," "but not limited to" or other like phrases in some instances are intended to be interpreted to contemplate broader meanings, but must not be understood to mean that narrower meanings are implied, intended, or required.

What is claimed is:

1. A combustion engine electromagnetic energy disruptor, comprising:
   a shaped disruptor carried in an enclosure and configured to distort electromagnetic energy proximate a combustion engine and fuel system, with electromagnetically responsive constituents dispersed in a substantially water-free resin hardened above about Shore D 60 into a predetermined volume and density;
   wherein a permittivity of the: (a) enclosure does not exceed about 3.5, and (b) resin and constituents in combination substantially exceeds about 3.5; and
   wherein the constituents include at least two or more of quartz, zinc oxide, graphite, iron oxide, copper oxide, aluminum, tourmaline, magnetite, iron, and combinations thereof.

2. The combustion engine electromagnetic energy disruptor, according to claim 1, further comprising:
   the resin including a urethane resin mixed prior to curing into a substantially homogenous dispersion with the constituents.

3. The combustion engine electromagnetic energy disruptor, according to claim 1, further comprising:
   the constituents further including one or more of: paramagnetic, ferrimagnetic, and ferromagnetic materials.

4. The combustion engine electromagnetic energy disruptor, according to claim 3, further comprising:
   the piezoelectric, diamagnetic, paramagnetic, ferrimagnetic, and ferromagnetic materials including two or more of the powdered quartz, black tourmaline, magnetite, iron, iron oxide, zinc oxide, copper oxide, aluminum, and graphite.

5. The combustion engine electromagnetic energy disruptor, according to claim 1, further comprising:
   the disruptor including the resin and the combined constituents being combined approximately in a one-to-one mass ratio.

6. The combustion engine electromagnetic energy disruptor, according to claim 1, further comprising:
   the disruptor including the constituents and resin being combined in a total mass ratio of about 50% resin and 50% powdered constituents, the constituents including:
   about 7.45% each of quartz, black tourmaline, and magnetite,
   about 5.32% each of iron, iron oxide, zinc oxide, copper oxide, and aluminum, and about 1.08% graphite.

7. The combustion engine electromagnetic energy disruptor, according to claim 1, further comprising:
   including constituents having diamagnetic properties, and including one or more of:
   (a) quartz having a permittivity of about between 4.2 and 6.5,
   (b) zinc oxide having a permittivity of about between 1.7 and 2.5, and
   (c) graphite having a permittivity of about between 12 and 15, and
   such that a combined permittivity of the diamagnetic constituents exceeds about 3.5.

8. The combustion engine electromagnetic energy disruptor, according to claim 1, further comprising:
   including constituents having paramagnetic properties and including one or more of:
   (a) iron oxide having a permittivity of about 14,
   (b) copper oxide having a permittivity of about 18, and
   (c) aluminum powder having a permittivity of about between 1.6 and 1.8, and such that a combined permittivity of the paramagnetic constituents exceeds about 3.5.

9. The combustion engine electromagnetic energy disruptor, according to claim 1, further comprising:
   the constituents being one or more of ferromagnetic and ferrimagnetic constituents, and including one or more of:

(a) Schorl tourmaline having a permittivity of about between 5 and 7,
(b) magnetite having a permittivity of about between 20 and 100, and
(c) iron powder having a permittivity exceeding about 9,000, and
such that a combined permittivity of the ferromagnetic and ferrimagnetic constituents exceeds about 3.5.

10. A combustion engine electromagnetic energy disruptor, comprising:
a disruptor carried by an enclosure and configured to agitate electromagnetic energy proximate a combustion engine and fuel system, with a plurality of piezoelectric, diamagnetic, paramagnetic, ferrimagnetic, and ferromagnetic constituents dispersed in a hardened resin to form the disruptor;
wherein a respective permittivity of the: (a) enclosure is substantially below about 3.5, and (b) resin and constituents in combination substantially exceeds about 3.5; and
wherein the constituents include at two or more of quartz, zinc oxide, graphite, iron oxide, copper oxide, aluminum, tourmaline, magnetite, iron, and combinations thereof.

11. The combustion engine electromagnetic energy disruptor, according to claim 10, further comprising:
the piezoelectric and diamagnetic constituents including one or more of:
(a) quartz having a permittivity of about between 4.2 and 6.5,
(b) zinc oxide having a permittivity of about between 1.7 and 2.5, and
(c) graphite having a permittivity of about between 12 and 15,
such that a combined permittivity of the diamagnetic constituents exceeds about 3.5.

12. The combustion engine electromagnetic energy disruptor, according to claim 10, further comprising:
the paramagnetic constituents including one or more of:
(a) iron oxide having a permittivity of about 14,
(b) copper oxide having a permittivity of about 18, and
(c) aluminum powder having a permittivity of about between 1.6 and 1.8, such that a combined permittivity of the paramagnetic constituents exceeds about 3.5.

13. The combustion engine electromagnetic energy disruptor, according to claim 10, further comprising:
one or more of the ferromagnetic and ferrimagnetic constituents including one or more of:
(a) Schorl tourmaline having a permittivity of about between 5 and 7,
(b) magnetite having a permittivity of about between 20 and 100, and
(c) iron powder having a permittivity exceeding about 9,000,
such that a combined permittivity of the paramagnetic constituents exceeds about 3.5.

14. The combustion engine electromagnetic energy disruptor, according to claim 10, further comprising:
the resin including a urethane resin hardened above about Shore D 60 to have a predetermined volume and density, which is mixed prior to curing into a homogenous dispersion with the constituents.

15. The combustion engine electromagnetic energy disruptor, according to claim 10, further comprising:
the constituents having diamagnetic properties that include one or more of the quartz, zinc oxide, and graphite;
the constituents having paramagnetic properties that include one or more of the iron oxide, copper oxide, and aluminum powder; and
the constituents having one or more of ferromagnetic and ferrimagnetic properties, and including one or more of the Schorl tourmaline, magnetite, and iron powder.

16. The combustion engine electromagnetic energy disruptor, according to claim 10, further comprising:
the disruptor including the constituents and resin being combined approximately in a one-to-one total mass ratio of resin and powdered constituents; and
the constituents including about 7.45% each of quartz, black tourmaline, and magnetite, about 5.32% each of iron, iron oxide, zinc oxide, copper oxide, and aluminum, and about 1.08% graphite.

17. A method for disrupting electromagnetic energy of a combustion engine, comprising:
forming a disruptor within an enclosure to have a volume and density, configured to agitate ambient electromagnetic energy proximate a combustion engine and fuel system, with a plurality of dispersed piezoelectric, diamagnetic, paramagnetic, ferrimagnetic, and ferromagnetic constituents;
wherein a respective permittivity of the: (a) enclosure is substantially below about 3.5, and (b) resin and constituents in combination substantially exceeds about 3.5; and
wherein the constituents include at least two or more of quartz, zinc oxide, graphite, iron oxide, copper oxide, aluminum, tourmaline, magnetite, iron, and combinations thereof.

18. The method for disrupting electromagnetic energy of a combustion engine according to claim 17, further comprising:
combining in the disruptor, the constituents with a hardened resin in about a one-to-one total mass ratio of resin and powdered constituents; and configuring the constituents to include about 7.45% each of quartz, black tourmaline, and magnetite, about 5.32% each of iron, iron oxide, zinc oxide, copper oxide, and aluminum, and about 1.08% graphite; and
further configuring the piezoelectric and diamagnetic constituents to include one or more of:
(a) the quartz having a permittivity of about between 4.2 and 6.5,
(b) the zinc oxide having a permittivity of about between 1.7 and 2.5, and
(c) the graphite having a permittivity of about between 12 and 15, and
such that a combined permittivity of the diamagnetic constituents exceeds about 3.5.

19. The method for disrupting electromagnetic energy of a combustion engine according to claim 17, further comprising:
combining in the disruptor, the constituents with a hardened resin in about a one-to-one total mass ratio of resin and powdered constituents; and
configuring the constituents to include about 7.45% each of quartz, black tourmaline, and magnetite, about 5.32% each of iron, iron oxide, zinc oxide, copper oxide, and aluminum, and about 1.08% graphite; and
further configuring the paramagnetic constituents to include one or more of:
(a) iron oxide having a permittivity of about 14,
(b) copper oxide having a permittivity of about 18, and
(c) aluminum powder having a permittivity of about between 1.6 and 1.8, such that a combined permittivity of the paramagnetic constituents exceeds about 3.5.

20. The method for method for disrupting electromagnetic energy of a combustion engine according to claim 17, further comprising:

combining in the disruptor, the constituents with a hardened resin in about a one-to-one total mass ratio of resin and powdered constituents; and configuring the constituents to include about 7.45% each of quartz, black tourmaline, and magnetite, about 5.32% each of iron, iron oxide, zinc oxide, copper oxide, and aluminum, and about 1.08% graphite; and further configuring one or more of the ferromagnetic and ferrimagnetic constituents to include one or more of:

(a) Schorl tourmaline having a permittivity of about between 5 and 7, (b) magnetite having a permittivity of about between 20 and 100, and (c) iron powder having a permittivity exceeding about 9,000, such that a combined permittivity of the paramagnetic constituents exceeds about 3.5.

\* \* \* \* \*